(12) United States Patent
Ohsaki

(10) Patent No.: US 7,154,582 B2
(45) Date of Patent: Dec. 26, 2006

(54) EXPOSURE APPARATUS AND METHOD

(75) Inventor: Yoshinori Ohsaki, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 142 days.

(21) Appl. No.: 10/778,978

(22) Filed: Feb. 13, 2004

(65) Prior Publication Data

US 2004/0189963 A1    Sep. 30, 2004

(30) Foreign Application Priority Data

Feb. 14, 2003   (JP)   ............................. 2003-037290

(51) Int. Cl.
*G03B 27/42*   (2006.01)

(52) U.S. Cl. ............................. 355/53; 355/67; 355/70; 355/71; 356/399; 356/400

(58) Field of Classification Search ..................... None
See application file for complete search history.

(56) References Cited

U.S. PATENT DOCUMENTS

| | | | | |
|---|---|---|---|---|
| 5,850,279 | A * | 12/1998 | Nara et al. | 355/53 |
| 6,727,980 | B1 * | 4/2004 | Ota et al. | 355/53 |
| 2002/0175300 | A1 * | 11/2002 | Suzuki et al. | 250/548 |
| 2005/0046846 | A1 * | 3/2005 | Chandhok | 356/401 |

\* cited by examiner

*Primary Examiner*—D. Rutledge
(74) *Attorney, Agent, or Firm*—Morgan & Finnegan, LLP

(57) ABSTRACT

An exposure apparatus for projecting a pattern of a reticle onto an object to be exposed with first light having a wavelength of 20 nm or smaller, said exposure apparatus comprising a projection optical system for projecting the pattern onto the object, and a position detecting system for detecting a positional information of a mark by receiving a second light having a wavelength different from that of the first light via the projection optical system.

14 Claims, 13 Drawing Sheets

PRIOR ART

EXPOSURE APPARATUS AND METHOD

This application claims a benefit of priority based on Japanese Patent Application No. 2003-037290, filed on Feb. 14, 2003, which is hereby incorporated by reference herein in its entirety as if fully set forth herein.

BACKGROUND OF THE INVENTION

The present invention relates to an exposure apparatus, and more particularly to an exposure apparatus that exposes an object, such as a single crystal substrate and a glass plate for a liquid crystal display ("LCD"). The present invention is suitable, for example, for an exposure apparatus that uses extreme ultraviolet ("EUV") light, such as soft X-ray, for an exposure light source.

In manufacturing such fine semiconductor devices as semiconductor memories and logic circuits in photolithography technology, reduction projection exposure apparatus have been conventionally employed which use a projection optical system to project a circuit pattern formed on a mask or a reticle onto a wafer, etc. to transfer the circuit pattern. Proximity exposure apparatuses have also conventionally been employed which directly transfer a circuit pattern on a reticle onto a wafer.

The minimum critical dimension ("CD") to be transferred by the projection exposure apparatus or resolution is proportionate to a wavelength of light used for exposure, and inversely proportionate to the numerical aperture ("NA") of the projection optical system. The shorter the wavelength is, the better the resolution is. Recent demands for finer semiconductor devices have promoted a shorter wavelength of ultraviolet light from an ultra-high pressure mercury lamp (i-line with a wavelength of about 365 nm) to KrF excimer laser (with a wavelength of about 248 nm) and ArF excimer laser (with a wavelength of about 193 nm). The lithography using the ultraviolet light, however, has the limit to satisfy the rapidly progressing fine processing of semiconductor devices. Accordingly, there has been developed a reduction projection optical system using EUV light with a wavelength less than about 100 nm (referred to as an "EUV exposure apparatus" hereinafter) for clear transfers of very fine circuit patterns. The EUV light's wavelength is shorter than that of $F_2$ laser (with a wavelength of about 157 nm) as the UV light.

Absorptive materials, such as oxygen molecules, water molecules and carbon dioxide included in the air greatly absorb the optical energy of light in a wave range between 100 nm and 200 nm in the vacuum UV range, and thus such light has a difficulty in transmitting through the air. Accordingly, an exposure apparatus that uses ArF excimer laser and $F_2$ laser as a light source needs to purge an optical path for the exposure light with inert gas, such as nitrogen and helium. In particular, the EUV exposure apparatus needs to maintain the optical path for the exposure light vacuum, because gas in the optical path absorbs and scatters the exposure light and prevents its transmissions.

Since materials greatly absorb the light of a wave range of the EUV light, a refractive optical system (that utilizes lenses or refractions of light) for use with visual light and UV light is not viable because of the low transmittance of the EUV light to an optical element, such as a lens. Therefore, a catoptric optical system is used which utilizes reflections of light.

An optical element for use with the catoptric optical element includes an oblique incidence total reflection mirror and a multilayer mirror. The wave range of the EUV light has a refractive index's real part of slightly smaller than 1, and is totally reflected by increasing an incident angle to introduce the light almost parallel to the reflective surface. The oblique incidence total reflection mirror utilizes this feature. Usually, the reflectance of 80% or greater is available to an oblique incidence with an angle between several degrees to 10° from the reflective surface (or an incident angle between a little larger than 70 and 90°). However, the oblique incidence total reflection mirror disadvantageously makes an optical system large due to little degree of freedom of the optical design cause by the limited incident angle.

On the other hand, the multilayer mirror alternately layers two different types of thin films having different optical constants or refractive indexes, and can use an incident angle close to perpendicular incidence. Proper selections of materials for these thin films and the number of layers would increase the reflectance up to about 70%.

The EUV exposure apparatus thus uses for a projection optical system a multilayer mirror that has larger degree of freedom than that of an oblique incidence total reflection mirror.

An exposure apparatus needs an alignment between a reticle and a wafer in exposure, and includes plural alignment optical systems. FIG. 15 is a schematic structure of a conventional exposure apparatus 1000 that uses KrF excimer laser and ArF excimer laser etc. for an exposure light source. The alignment optical system can be roughly classified into two types, i.e., an off-axis optical detection system 1400 that detects an alignment mark on a wafer 1300 for use with a wafer alignment, and a Through The Reticle ("TTR") alignment optical system 1500 that detects a position of an alignment mark on a reticle 1100 relative to the alignment mark on the wafer 1300 through a projection optical system. The TTR alignment optical system is sometimes referred to as a Through The Lens ("TTL") alignment optical system.

The off-axis alignment optical system 1400 serves to detect a position of the wafer 1300 for alignments of the wafer 1300 at a position different from an exposure position. Therefore, a precise alignment needs to maintain a baseline between the exposure position and the alignment position. Accordingly, the TTR alignment optical system 1500 needs to measure the baseline for alignments with higher precision than the baseline stability.

The TTR alignment optical system 1500 introduces light from an exposure light source (not shown) into an illumination part 1520 through an optical fiber 1510, etc., illuminates an alignment mark on the reticle 1100, and forms an image of the alignment mark on the illuminated reticle 1100 onto an image pickup device 1550 while enlarging the image through an objective lens 1530 and a relay lens 1540. The TTR alignment optical system 1500 preferably uses a light source that has the same wavelength as an exposure wavelength, and usually employs an exposure light source. A light source can use non-exposure light, but this configuration undesirably needs to correct the chromatic aberration in the projection optical system 1200.

The light that has transmitted through the reticle 1100 and the projection optical system 1200 illuminates an alignment mark on a wafer-side reference plate 1352. An image of the illuminated alignment mark is formed on the reticle 1100 via the projection optical system 1200, and an enlarged image is formed on the image pickup device 1550 through the objective lens 1530, the relay lens 1540, etc.

Use of the exposure light would maintain the same imaging relationship between the alignment marks on the reticle 1100 and the wafer-side reference plate 1352, as that for the exposure-time, and enable the same optical system to simultaneously detect these marks. An exposure position of a pattern or a mark on the reticle 1100 can be measured with precision without being affected by the optical system's errors, etc. In addition, the baseline or an arrangement between the exposure position (or reticle mark) and a position of the off-axis alignment optical system 1400 can be assured by driving the wafer stage 1530 and detecting the alignment mark on the wafer-side reference plate 1352 through the off-axis alignment optical system 1400.

Some TTR alignment optical systems illuminate an alignment mark on a wafer-side reference plate from a backside of the wafer-side reference plate (or an opposite side to the projection optical system) to form an image of the alignment mark on a reticle-side reference plate through a projection optical system, and illuminate the alignment mark on the reticle-side reference plate to image the transmitted light on an image pickup device.

An alternative type makes alignment marks on a reticle and a wafer-side reference plate of repetitive patterns of a light-shielding part and a light-transmitting part. These patterns are different in size by a magnification of the projection optical system. This type illuminates the repetitive pattern on the reticle from a backside of the reticle (or backside of the projection optical system) to project the pattern onto the repetitive pattern on the wafer-side reference plate via the projection optical system, and detects the light that has transmitted through the wafer-side reference plate while moving the wafer stage.

The TTR alignment optical system thus can detect a position of the wafer-side alignment mark relative to the reticle-side alignment mark, or a position of the reticle-side alignment mark relative to the wafer-side alignment mark.

When the EUV exposure apparatus applies exposure light to the alignment optical system, the TTR alignment optical system cannot use a conventionally available refractive element, such as a lens, but use only mirrors to form an image of an alignment mark on an image pickup device. Therefore, a conventionally available compact optical system is inapplicable.

In general, the alignment optical system forms an image of the alignment mark of twenty magnifications or greater on the image pickup device, and the enlarged magnification lowers the light intensity. For example, the alignment optical system of twenty optical magnifications lowers the light intensity on the reticle surface down to 1/400 on the image pickup device. Moreover, the multilayer mirror has reflectance of about 70% to the EUV light, posing a problem of efficiency or reflectance of the optical system: If the alignment optical system of twenty optical magnifications uses about ten multilayer mirrors, although the number of mirrors depends upon the permissible size of the alignment optical system, the reflectance becomes about 2.8%. On the other hand, the efficiency (or transmittance) of a lens-using alignment optical system in a conventional exposure apparatus is 90.5% when the alignment optical system uses ten lenses and each lens has reflectance of 0.5%. Therefore, the efficiency is 30 times as large as that for the EUV light. Therefore, the TTR alignment optical system that uses the EUV light cannot configure a detection system as high-magnification and precise as the prior art.

Even without the enlargement optical system, a light-receiving sensor for detecting the EUV light would raises a durability problem. In addition, since the EUV exposure apparatus is stricter in overlay precision than the prior art, frequent calibrations with the TTR alignment optical system are required for baseline corrections, etc. However, an EUV light source requires a high running cost, and frequent calibrations would increase the cost.

BRIEF SUMMARY OF THE INVENTION

Accordingly, it is an exemplified object of the present invention to provide an exposure apparatus and method that can provide a highly precise alignment with using the EUV light as an exposure light source.

An exposure apparatus of one aspect according to the present invention for projecting a pattern of a reticle onto an object to be exposed with first light having a wavelength of 20 nm or smaller, said exposure apparatus comprises a projection optical system for projecting the pattern onto the object, and a position detecting system for detecting a positional information of a mark by receiving a second light having a wavelength different from that of the first light via the projection optical system.

The second light has, for example, the wavelength between 150 nm and 370 nm.

Other objects and further features of the present invention will become readily apparent from the following description of the preferred embodiments with reference to accompanying drawings.

DETAILED DESCRIPTION OF THE PREFERRED EMBODIMENTS

In providing an exposure apparatus and method that can provide an exposure apparatus and method that can provide a highly precise alignment with a reasonable cost while using the EUV light as an exposure light source, the instant inventor has earnestly studied an EUV exposure apparatus that makes a projection optical system of only mirrors and does not have chromatic aberration, and discovered that the EUV exposure apparatus maintains an imaging relationship between the reticle surface and the wafer surface to both the EUV light and light other than the EUV light. In this embodiment, EUV light is defined as light having wavelength smaller than 100 nm, moreover, especially 20 nm.

Figure 6:
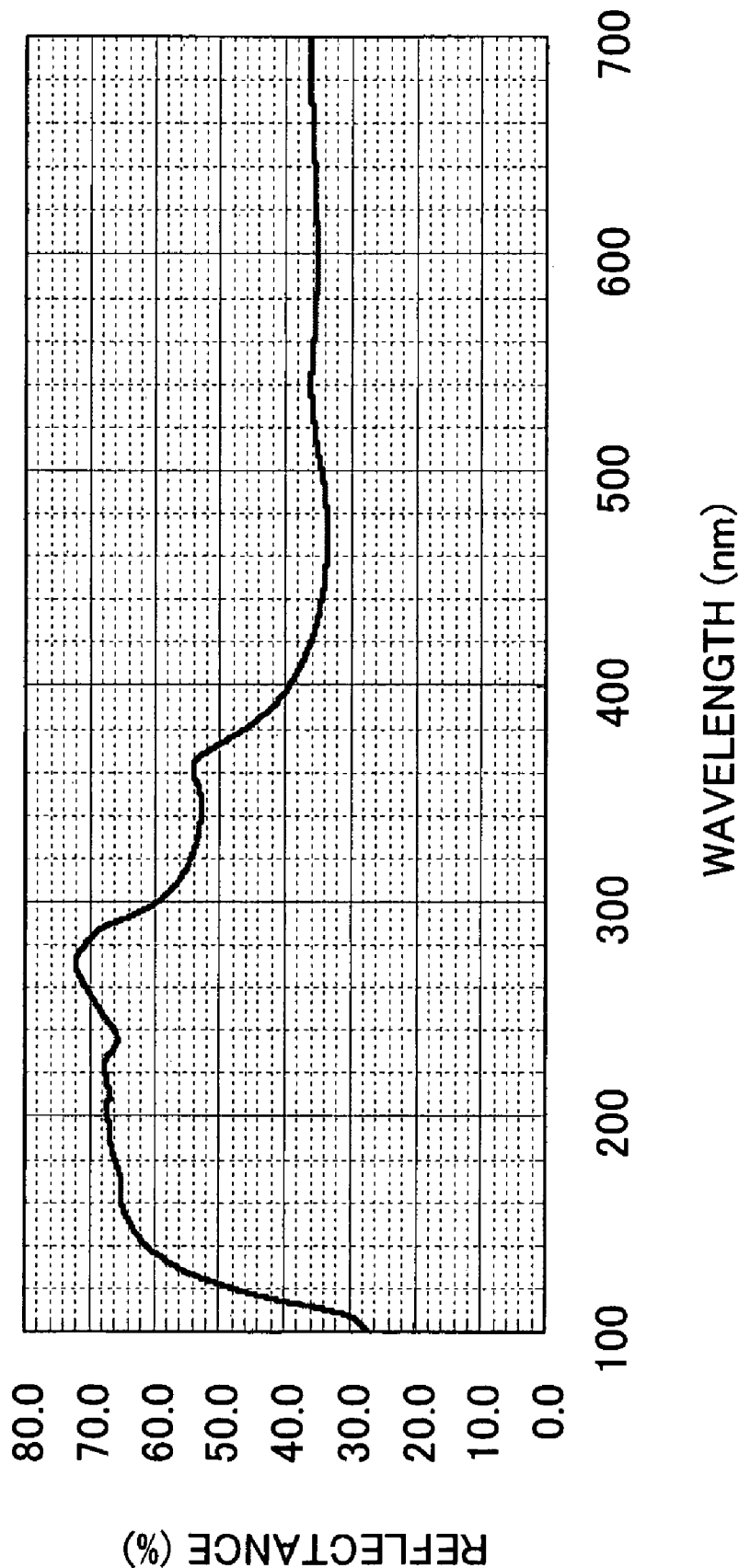
FIG. 6 is a graph showing reflectance of a multilayer mirror to light having a wavelength between 120 nm and 700 nm.

The instant inventor has then studied reflectance of a multilayer mirror used for a projection optical system in an EUV exposure apparatus to the light other than EUV light. The multilayer mirror alternately forms a molybdenum (Mo) layer and a silicon (Si) layer on a precisely polished surface on a glass plate. Each layer has a thickness from submicron to several nanometers. When each pair piles a Mo layer and a Si layer, about 20 to 50 pairs are formed. FIG. 6 shows the reflectance of a multilayer mirror that receives the light with a wavelength between 120 nm and 700 nm at an incidence angle of 0°, wherein an abscissa axis denotes the wavelength of the light incident upon the multilayer mirror, and an ordinate axis denotes the reflectance of the multilayer mirror's reflective surface.

Referring to FIG. 6, the multilayer mirror has reflectance of only 35%, for example, to He—Ne laser with a wavelength of 633 nm. Therefore, an optical system that includes, for example, six multilayer mirrors has efficiency or reflectance of 0.18% to the light with a wavelength of 633 nm, while an optical system that includes four multilayer mirrors has efficiency or reflectance of about 1.5% to light with a wavelength of 633 nm. It has been found that this optical system does not have chromatic aberration, but transmits light little.

As shown in FIG. 6, the multilayer mirror has reflectance greater than 50% to the UV light having a wavelength smaller than 370 nm, and an optical system that includes four multilayer mirrors maintains reflectance to be 6% or greater. In particular, the multilayer mirror has reflectance greater than 70% to light in a wave range between 260 nm and 280 nm, and an optical system that includes four multilayer mirrors maintains reflectance to be 24% or greater, similar to that for the EUV light.

The reflectance gradually lowers in a short wave range of 200 nm or smaller, and the multilayer mirror has reflectance of 50% for the light with a wavelength of around 130 nm. The multilayer mirror in the projection optical system in the EUV exposure apparatus has reflectance of 50% of higher to a wave range between 130 nm and 370 nm. Therefore, the projection optical system including four to six multilayer mirrors can maintain sufficient light intensity in the wave range between 130 nm and 370 nm for the TTL alignment that uses the projection optical system.

The TTR alignment needs an optical system for imaging light emitted from the projection optical system onto an image pickup device (light receiving means). Use of a multilayer mirror for this optical system would naturally further lower the light intensity, and the image pickup device cannot obtain sufficient light intensity. Light having a wavelength of 150 nm or greater can transmit through a lens, unlike the EUV light, and an optical system of dioptric type, which comprises lenses and no mirror, is applicable. In addition, a lens has high transmittance to light with a wavelength of 150 nm or greater, and a reduction of the light intensity in the optical system that uses a lens does not pose a great problem. On the other hand, no glass materials can transmit light having a wavelength of 150 nm or smaller, and thus an optical system that uses a lens is not applicable.

Thus, the instant inventor has discovered that an EUV exposure apparatus can use, as an alignment optical system, a conventional TTR alignment optical system that includes refractive elements and is not a catoptric optical system, with the UV light having a wavelength between 150 nm and 370 nm as alignment light (i.e., light used for alignments). The above discussion of the reflectance at an incident angle of 0° is universally true of the multilayer mirrors for the EUV light, since the incident angle upon each mirror in the projection optical system is made as small as possible and 30° at most for efficient reflections of the EUV light.

Referring now to accompanying drawings, a description will be given of an exposure apparatus 100 of one embodiment according to the present invention. Like elements in respective views are designated by like reference numerals, and a description thereof will be omitted. Here, FIG. 1 is a schematic structure of exposure apparatus 100.

The exposure apparatus 100 uses, as illumination light for exposure, EUV light (with a wavelength of, e.g., 13.4 nm) to exposes onto an object 140 a circuit pattern formed on a reticle 120, for example, in a step-and-repeat manner and step-and-scan manner. This exposure apparatus 100 is suitable for a lithography process less than submicron or quarter micron, and the present embodiment uses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

Figure 1:
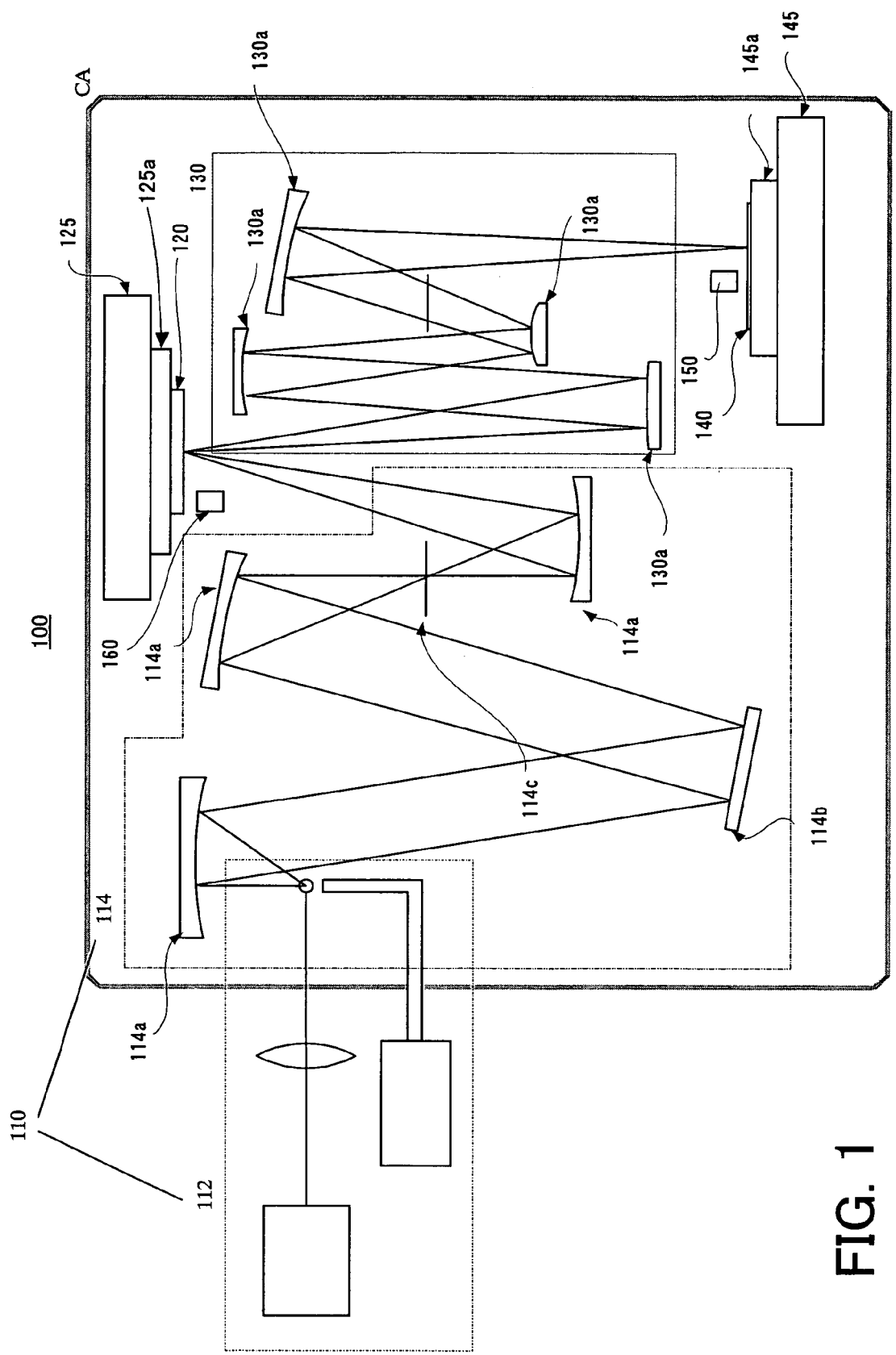
FIG. 1 is a schematic structure of an exposure apparatus of one aspect according to the present invention.

Referring to FIG. 1, the exposure apparatus 100 includes an illumination apparatus 110, a reticle 120, a reticle stage 125 that mounts the reticle 120, a projection optical system 130, an object to be exposed 140, a wafer stage 145 that mounts the object 140, and an off-axis alignment detection mechanism 150, and a TTR alignment optical system 160.

A vacuum chamber CA preferably maintains an optical path in a vacuum atmosphere, as shown in FIG. 1, through which optical path the EUV light passes or an entire optical system, due to low transmittance to air of the EUV light and a generation of contamination through a reaction with residual gas, such as polymer organic gas.

The illumination apparatus 110 uses arc-shaped EUV light, for example, with a wavelength of 13.4 corresponding to an arc-shaped field of the projection optical system 130 to illuminate the reticle 120, and includes an EUV light source 112 and illumination optical system 114.

The EUV light source 112 employs, for example, a laser plasma light source. It generates high temperature plasma by irradiating a pulsed laser beam with high intensity onto a target material in a vacuum chamber, and uses the EUV light, for example, with a wavelength of about 13 nm, which has been emitted from the plasma. The target material may use a metallic thin film, an inert gas, a liquid-drop, etc., and the target supply unit may use a gas jet and so on. The pulse laser is usually driven with a higher repetitive frequency, such as several kHz, for increased average intensity of radiated EUV light.

The illumination optical system 114 is to introduce the EUV light from the EUV light source 112 to the reticle 120, and includes plural multilayer mirrors or oblique incidence mirrors (or condenser mirrors) 114a, an optical integrator 114b, etc. The condenser mirror 114a serves to collect the EUV light that is isotropically irradiated from the laser plasma. The optical integrator 114b serves to uniformly illuminate the reticle 120 with a predetermined NA. The illumination optical system 114 further includes an (angle-of-view restricting) aperture 114c to limit the illumination area to an arc shape at a position conjugate with the reticle 120.

The reticle 120 is a reflection mask that forms a circuit pattern or image to be transferred, and supported and driven by the reticle stage 125. The diffracted light from the reticle 120 is reflected by the projection optical system 130 and projected onto the object 540. The reticle 120 and the object 140 are arranged optically conjugate with each other. The exposure apparatus 100 is a step-and-scan exposure apparatus, and projects a reduced size of the pattern on the reticle 120 on the object 140 by scanning the reticle 120 and the object 140.

The reticle stage 125 supports the reticle 120 via a reticle chuck 125a, and is connected to a moving mechanism (not shown). A moving mechanism (not shown) may include a linear motor etc., and drives the reticle stage 125 at least in a direction X and moves the reticle 120. The exposure apparatus 100 assigns the direction X to scan the reticle 120 or the object 140, a direction Y perpendicular to the direction X, and a direction Z perpendicular to the reticle 120 or the object 140.

The projection optical system 130 uses plural multilayer mirrors 130a to project a reduced size of a pattern formed on the reticle 120 onto the object 140. Since the smaller number of mirrors 130a would enhance the use efficiency of the EUV light but make aberrational corrections difficult, the number of mirrors is about four to six. For wide exposure area with the small number of mirrors, the reticle 120 and object 140 are simultaneously scanned to transfer a wide area that is an arc-shaped area or ring field apart from the optical axis by a predetermined distance. The projection optical system 130 has a NA of about 0.2 to 0.3. The mirror 130a makes its substrate of a rigid and hard material with low coefficients of thermal expansion, such as low expansion coefficient glass or silicon carbide, shapes a predetermined (e.g., concave or convex spherical or aspheric) reflective surface through grounding and polishing, and then forms a multilayer film, such as molybdenum/silicon, on the reflective surface. When the EUV light does not have constant incident angles upon the mirror 130a, a multilayer film with a constant film cycle enhances the reflectance depending upon a location and offsets the wavelength of the EUV light. Accordingly, a film cycle distribution is arranged so that the EUV light with the same wavelength may be reflected efficiently on a mirror surface.

The instant embodiment uses a wafer as the object to be exposed 140, but it may include a spherical semiconductor and liquid crystal plate and a wide range of other objects to be exposed. Photoresist is applied onto the object 140.

An object to be exposed 140 is held onto the wafer stage 145 by a wafer chuck 145a. Similar to the reticle stage 125, the wafer stage 145 moves the object 140, for example, using a linear stage in XYZ-axes directions and rotational directions around respective axes. The positions of the reticle stage 125 and wafer stage 145 are monitored, for example, by a laser interferometer, and driven at a constant speed ratio.

The off-axis alignment optical system 150 is used for wafer alignments, and detects an object 140's alignment mark and position. The off-axis alignment optical system 150 can use any structure known in the art, and includes an alignment light source, an illumination optical system, a detection optical system, and an image pickup device. An optical element, such as an optical fiber and a lens, introduces non-exposure light from an alignment light source into the illumination optical system to illuminate an alignment mark on the object 140. An illuminated alignment mark is enlarged by the detection optical system, such as an objective lens and a relay lens, before imaged on the image pickup device, such as a CCD. The off-axis alignment optical system 150 can detect the object 140's position in view of the fact that an image position on the CCD changes as the alignment mark position changes.

The TTR alignment optical system 160 detects a position of an alignment mark on the object 140 to the alignment mark on the reticle 120, via the projection optical system 130. The TTR alignment optical system 160 uses the UV light for alignments, which is introduced in the projection optical system 130 so that the light, which is not the EUV light emitted from the EUV light source 112, can have the same optical path as that of the EUV light at least one image point in the projection optical system 130.

Figure 2:
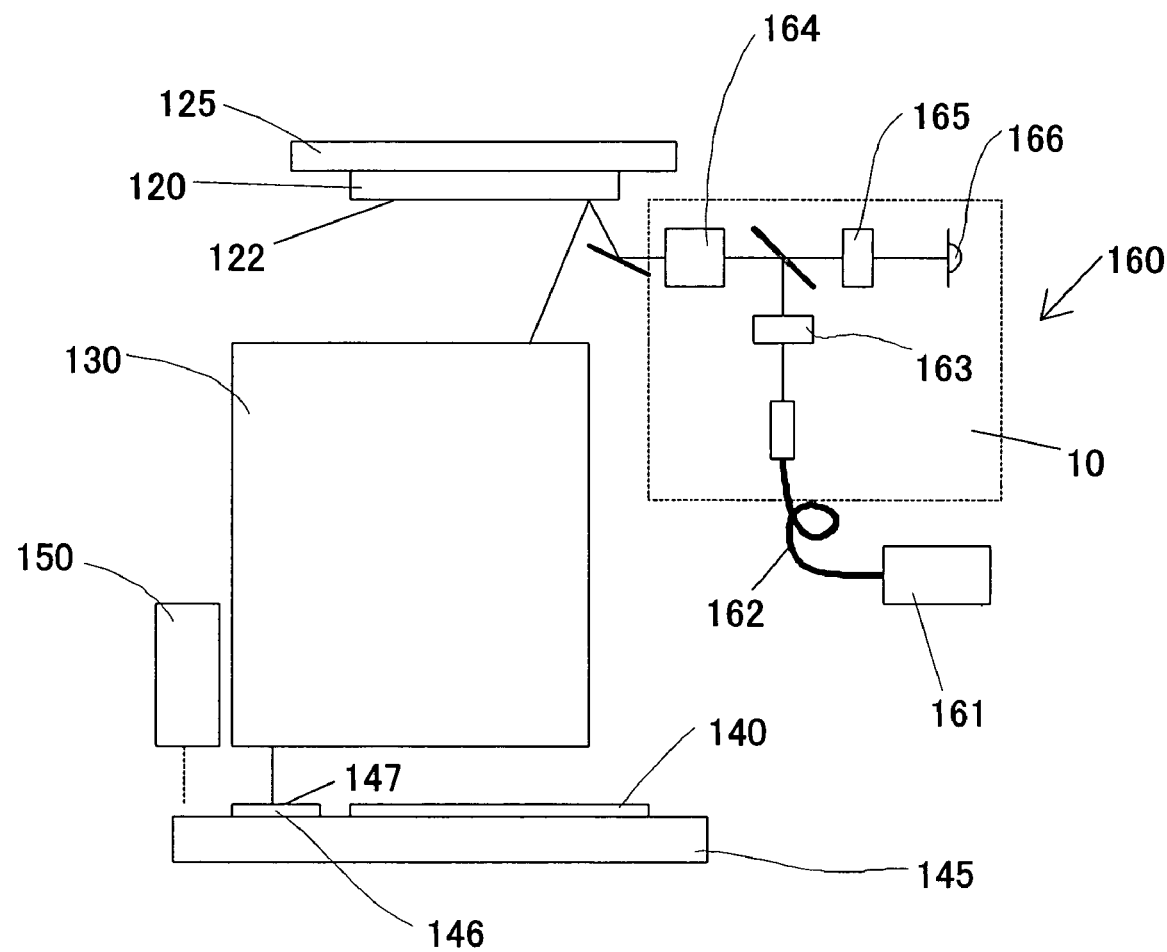
FIG. 2 is a schematic structure of a TTR alignment optical system shown in FIG. 1.

Referring now to FIG. 2, a concrete description will be given of the TTR alignment optical system 160. FIG. 2 is a schematic structure of the TTR alignment optical system 160. The TTR alignment optical system 160 includes a UV light source 161, an optical fiber 162, an illumination part 163, an objective lens 164, a relay lens 165, and an image pickup device 166. The UV light source 161 can be, for example, 2nd harmonics of the Ar laser (248 nm), 4th harmonics of Nd: YAG laser (266 nm), i-line (365 nm) or the shorter spectrum of Hg lamp, KrF excimer laser (248 nm), and ArF excimer laser (193 nm).

The UV light emitted from the UV light source 161 is introduced into the illumination part 163 in the TTR alignment optical system 160 through the optical fiber 162. The UV light introduced into the illumination part 163 illuminates a pattern surface on the reticle 120 via the objective lens 164, etc. The reticle 120 is a reflection mask, and reflects the UV light on its pattern surface towards the projection optical system 130. The same optical path is shared between the EUV light and the UV light at one image point at a certain location in the projection optical system 130 with the same NA and incident angle for both the UV light that illuminates the reticle 120 and the EUV light as exposure light. A variable position of the objective lens 164 would change the image point, and plural objective lenses 164 would enable the EUV light and the UV light to share the same optical path in the projection optical system 130 at plural image points.

Figure 3:
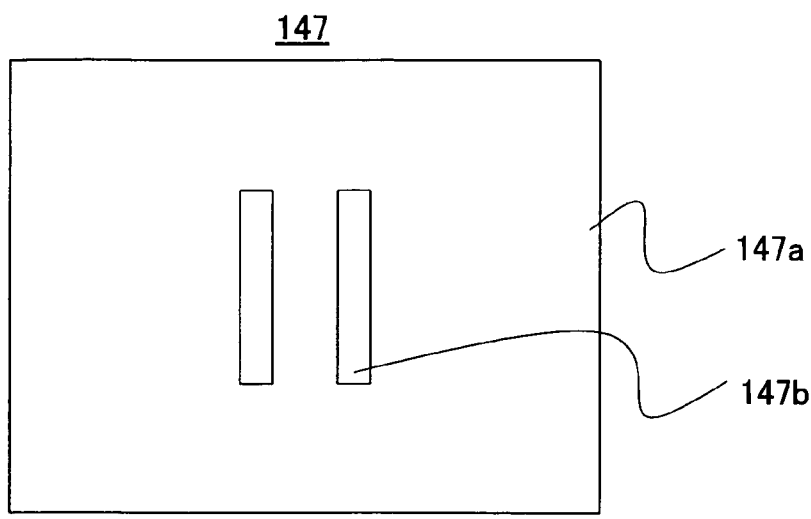
FIG. 3 is a schematic plane view of an alignment mark on a wafer-side reference plate.

The UV light reflected on the projection optical system 130 illuminates an alignment mark 147 on a wafer-side reference plate 146 provided on the wafer stage 145. As shown in FIG. 3, the alignment mark 147 includes, for example, a mark part 147b on a chrome surface 147a added to a substrate made of quartz, etc. The UV light that illuminates the alignment mark 147 is reflected on the chrome surface 147a, and absorbed by the mark part 147b. Here, FIG. 3 is a schematic plane view of the exemplary alignment mark 147 on the wafer-side reference plate 146.

The UV light reflected on the chrome surface 147a again enters the projection optical system 130. The projection optical system 130 that includes only mirrors does not have chromatic aberration, and maintains an imaging relationship between the reticle 120's surface and the object 140's surface even to the light other than the EUV light. In other words, the projection optical system 130 forms, onto the reticle 120's pattern surface, an image of the alignment mark 147 on the wafer-side reference plate 146 illuminated by the UV light.

A formed image of the alignment mark 147 is reflected by the pattern surface 122 of the reticle 120, enlarged by the objective lens 164 and the relay lens 165, and imaged on the image pickup device 166. A position of the wafer-side reference plate 146 is measurable by processing an image formed on the image pickup device 166. The image processing method includes template matching, symmetrical pattern matching, barycenter position detection, etc.

Figure 4:
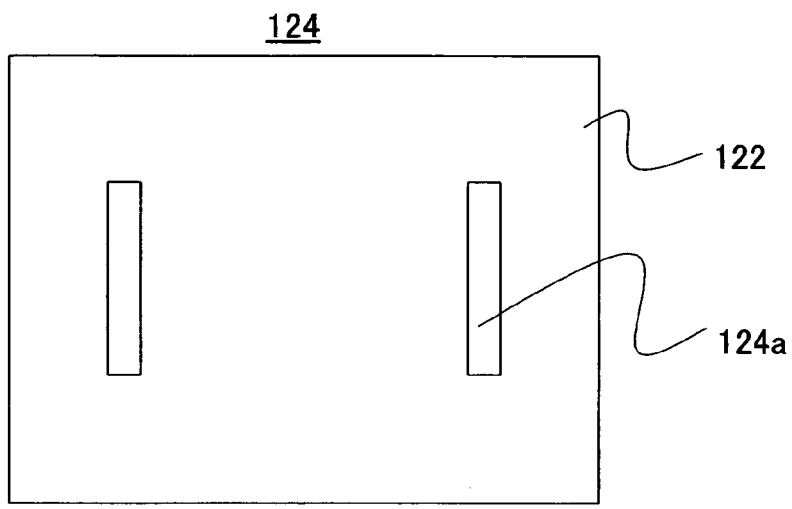
FIG. 4 is a schematic plane view of an alignment mark on a reticle pattern surface.

When the reticle 120 forms an alignment mark 124 on the pattern surface 122 with an absorbing material, such as metal, as shown in FIG. 4, the UV light is absorbed by the mark part 124a and reflected on the pattern surface 122. FIG. 4 is a schematic plane view of the exemplary alignment mark 124 on the pattern surface 122 of the reticle 120.

Figure 5:
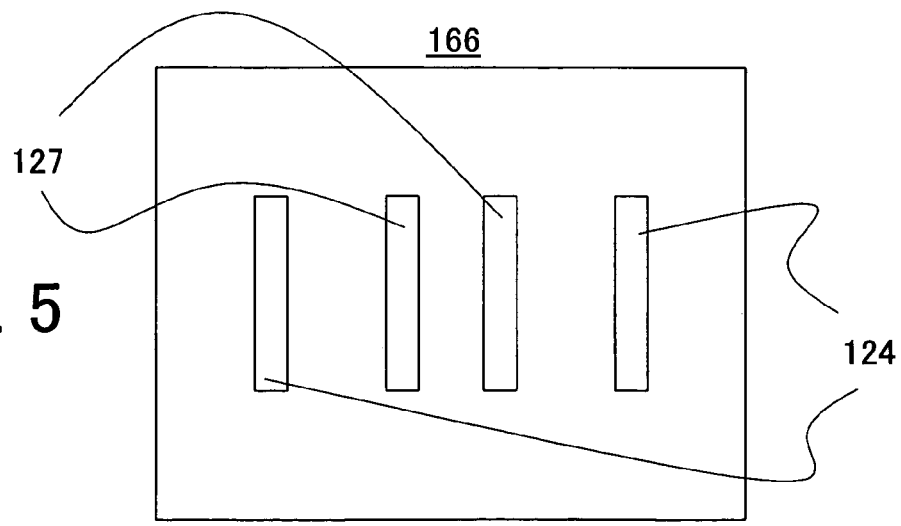
FIG. 5 is a schematic plane view of an alignment mark detected on an image pickup device in the TTR alignment optical system.

Accordingly, the alignment mark 124 on the reticle 120 and the alignment mark 147 on the wafer-side reference plate 146 are arranged so as not to overlap each other on the image pickup device 166, as shown in FIG. 5, these alignment marks 124 and 147 can be detected simultaneously and one measurement can detect a position of the wafer stage 145 relative to the reticle 120. FIG. 5 is a schematic plane view of the alignment marks 124 and 147 detected on the image pickup device 166 in the TTR alignment optical system 160.

Similar to the conventional exposure apparatus, the TTR alignment optical system 160 includes a refraction optical element, such as a lens, and a UV light source 161 that emits the UV light. Use of the EUV light as the alignment light would require the TTR alignment optical system to include only mirrors, causing significant attenuations of the light intensity in the TTR alignment optical system. On the other hand, use of the UV light as alignment light enables the TTR alignment optical system to use a refraction optical element, and does not cause an efficiency problem unlike the TTR alignment optical system that uses the EUV light as exposure light. Therefore, the TTR alignment optical system 160 can form images of alignment marks 124 and 147 of twenty magnifications on the image pickup device 166, such as a CCD for precise image detections and alignments. Since the TTR alignment optical system 160 uses the UV light instead of the EUV light source that requires a high running cost, maintaining the alignment's running cost as reasonable as the conventional alignment's one.

The catoptric projection optical system does not generate chromatic aberrations in the alignment light, and does not require a non-exposure light TTR alignment system to include a chromatic-aberration correction optical system usually necessary for a refractive projection optical system.

The UV light source 161 emits the UV light in a wave range preferably between 150 nm and 370 nm, and more preferably between 240 nm and 280 nm. As described with reference to in FIG. 6, the multilayer mirror has reflectance of 50% or higher to the UV light with a wavelength of 370 nm or smaller, and no glass material transmits the UV light below 150 nm. The multilayer mirror has the highest efficiency or reflectance, e.g., 65 to 70% or higher in the projection optical system to the UV light with the wavelength between 240 nm and 280 nm.

The exposure apparatus 100 includes the UV light source 161 that emits the UV light with a wavelength between 150 nm and 370 nm and uses the UV light for the TTR alignment optical system 160. The TTR alignment optical system 160 includes a refractive optical element made of a material, such as a calcium fluoride ($CaF_2$) and synthesized quarts, which has high transmittance to the UV light. The projection optical system 130 has transmittance of several % to 20% or higher to the UV light, equivalent to the EUV light. Therefore, the instant embodiment can maintain a TTR alignment optical system as high-magnification and precise as those of the prior art.

Figure 7:
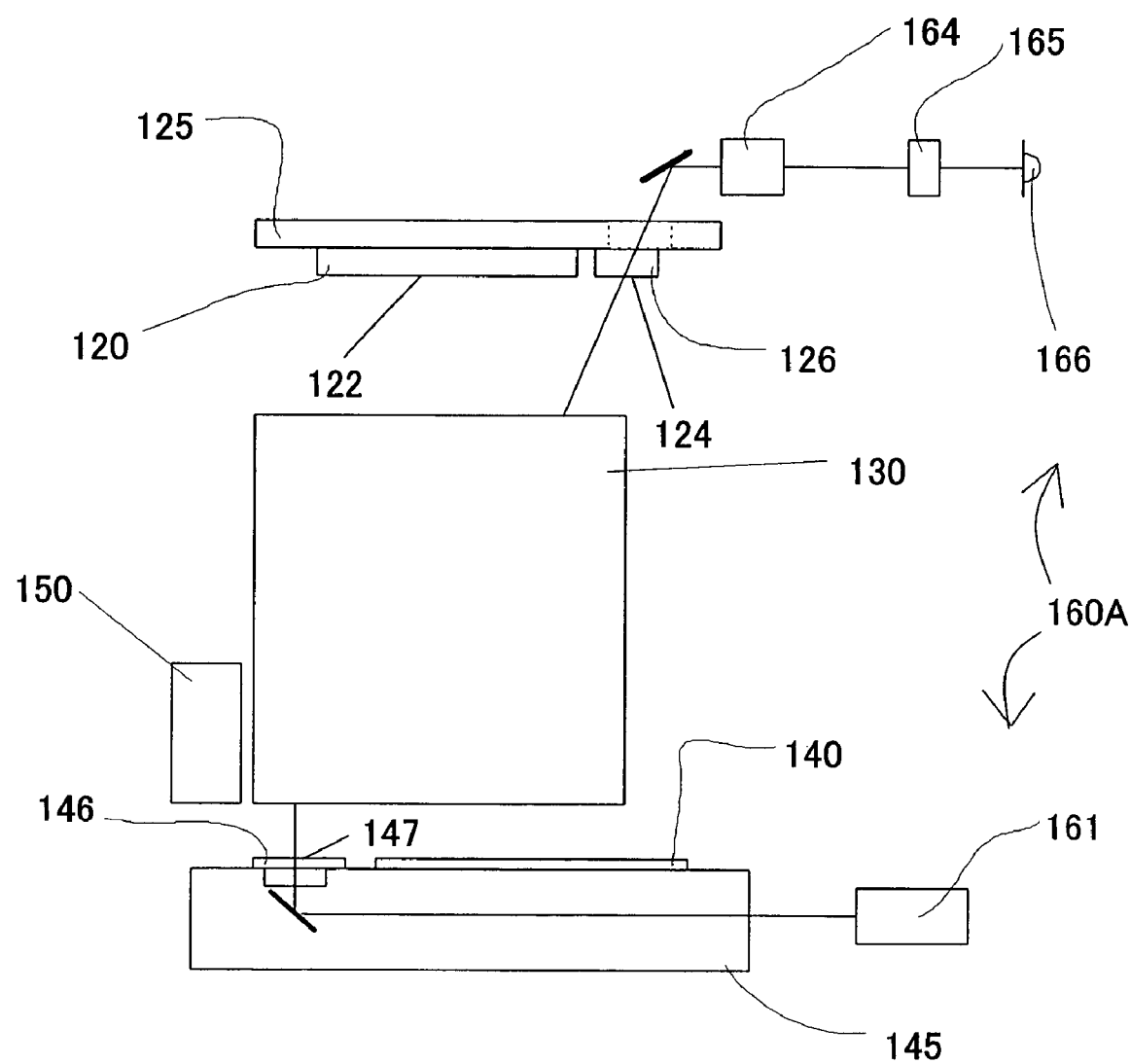
FIG. 7 is a schematic structure of a variation of the TTR alignment optical system shown in FIG. 2.

Referring now to FIG. 7, a description will be given of a TTR alignment optical system 160A as a variation of the TTR alignment optical system 160. FIG. 7 is a schematic structure of the TTR alignment optical system 160A.

The TTR alignment optical system 160A is similar to the TTR alignment optical system 160 shown in FIG. 2, but different in irradiating the UV light emitted from the UV light source 161 onto the alignment mark 147 from the rear surface of the wafer-side reference plate 146.

The TTR alignment optical system 160A introduces the UV light emitted from the UV light source 161 into the wafer stage 145, and illuminates the alignment mark 147 from the backside to the front side of the wafer-side reference plate 146. The projection optical system 130 forms an image of the alignment mark 147 on the wafer-side reference plate 146 illuminated by the UV light, onto the pattern surface on the reticle-side reference plate 126 provided on the reticle stage 125. The reticle-side reference plate 126 is made of a material that transmits the UV light, such as quartz. An image of the alignment mark 147 on the wafer-side reference plate 146, which has been formed on the pattern surface of the reticle-side reference plate 126, transmits through the reticle-side reference plate 126, and images on the image pickup device 166 through the objective lens 164 and the relay lens 165 in the TTR alignment optical system 160.

The alignment mark 124 is provided on the reticle-side reference plate 126. As shown in FIG. 5, the alignment mark 124 on the reticle 120 and the alignment mark 147 on the wafer-side reference plate 146 are arranged so as not to overlap each other on the image pickup device 166. As a result, these alignment marks 124 and 147 can be detected simultaneously and one measurement can detect a position of the wafer stage 145 relative to the reticle 120.

In the TTR alignment optical system 160 shown in FIG. 2, the UV light from the UV light source 161 reaches the image pickup device 166 after passing through the projection optical system 130 twice. On the other hand, in the TTR alignment optical system 160A of the instant embodiment, the UV light reaches the image pickup device 166 after passing through the projection optical system 130 once. The projection optical system 130 is made of four to six mirrors, and the-reflectance of each mirror to the UV light is about 70%. There is a large difference in effect between passages via the projection optical system 130 once and twice. For example, the four-mirror projection optical system has one-way efficiency of about 24%, and the two-way efficiency is reduced down to about 5.8%. Therefore, as in the TTR alignment optical system 160A, the efficiency becomes higher than the TTR alignment optical system 160 by irradiating the UV light onto the alignment mark 147 from the backside of the wafer-side reference plate 146, by allowing the UV light to pass via the projection optical system 130 only once, and by detecting an image using the image pickup device 166.

The EUV exposure apparatus is a wafer-side telecentric optical system, but is not telecentric at the reticle-side because of the design convenience of the projection optical system, e.g., for use of a reflection mask. Therefore, in measuring XY coordinates of an alignment mark, it is necessary to precisely focus the objective lens in the TTR alignment optical system onto the reticle or pattern surface on the reticle-side reference plate. A measurement of the XY coordinate of the alignment mark in the defocus state would offset the measurement value due to the inclination of the principal ray.

Figure 8:
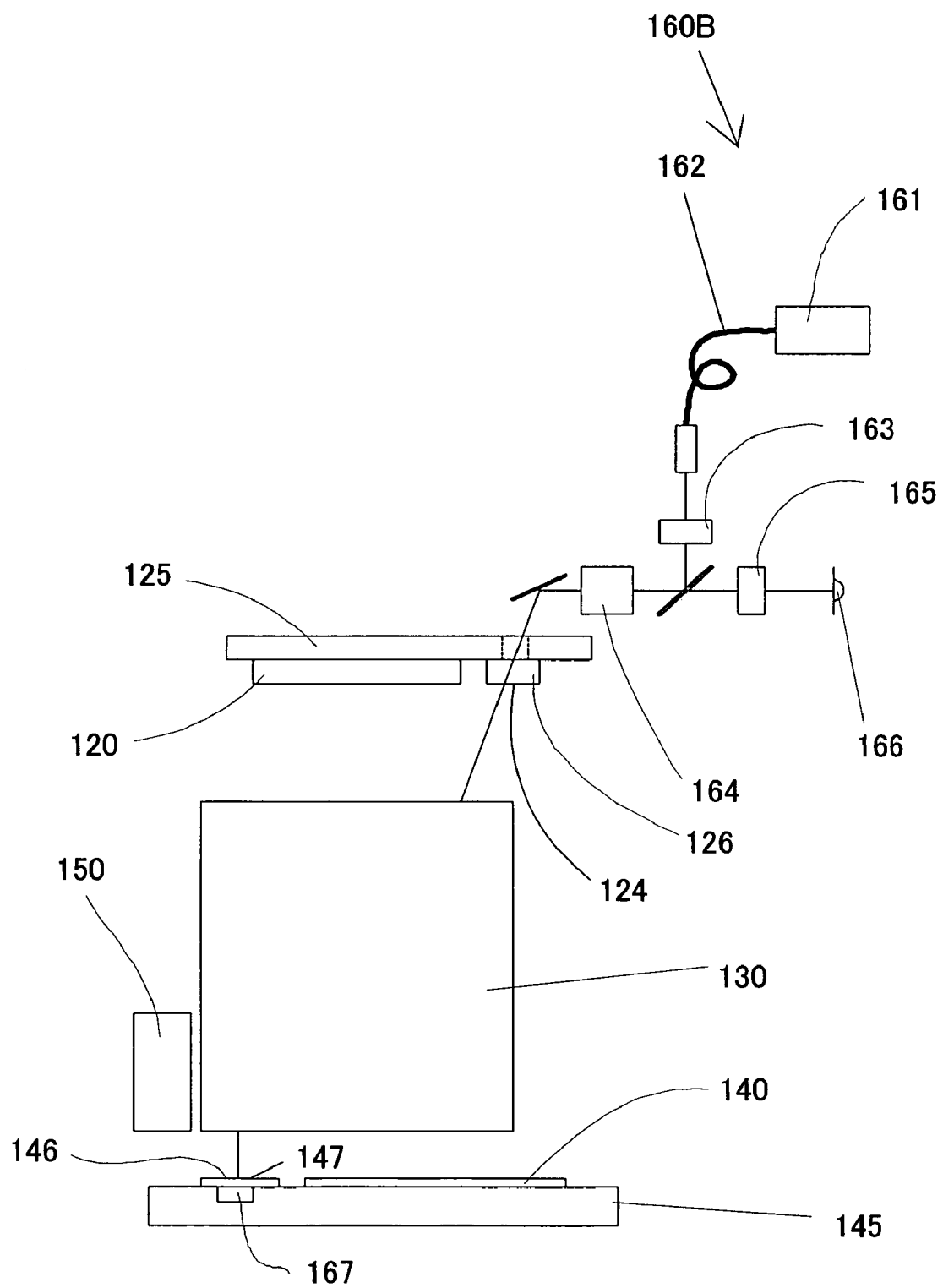
FIG. 8 is a schematic structure of a variation of the TTR alignment optical system shown in FIG. 7.

Referring now to FIG. 8, a description will be given of a TTR alignment optical system 160B as a variation of the TTR alignment optical system 160A.

FIG. 8 is a schematic structure of the TTR alignment optical system 160B.

The TTR alignment optical system 160A irradiates the UV light onto the alignment mark 147 from the backside of the wafer-side reference plate 146 and detects an image at the side of the reticle, whereas the TTR alignment optical system 160B irradiates, as shown in FIG. 8, the UV light onto the alignment mark from the backside of the reticle-side reference plate 126 provided on the reticle stage 125 and detects an image via the projection optical system 130 and the wafer-side reference plate 146.

In order to form an enlarged image of an alignment mark on the image pickup device through the enlargement optical system, like the TTR alignment optical system 160A, the enlargement optical system should include heavy members on the wafer stage 145, such as an objective lens and a relay lens. However, the wafer stage 145 moves quickly and is preferably lightweight. Therefore, it is not practical to mount the enlargement optical system on the wafer stage 145.

Figure 9:
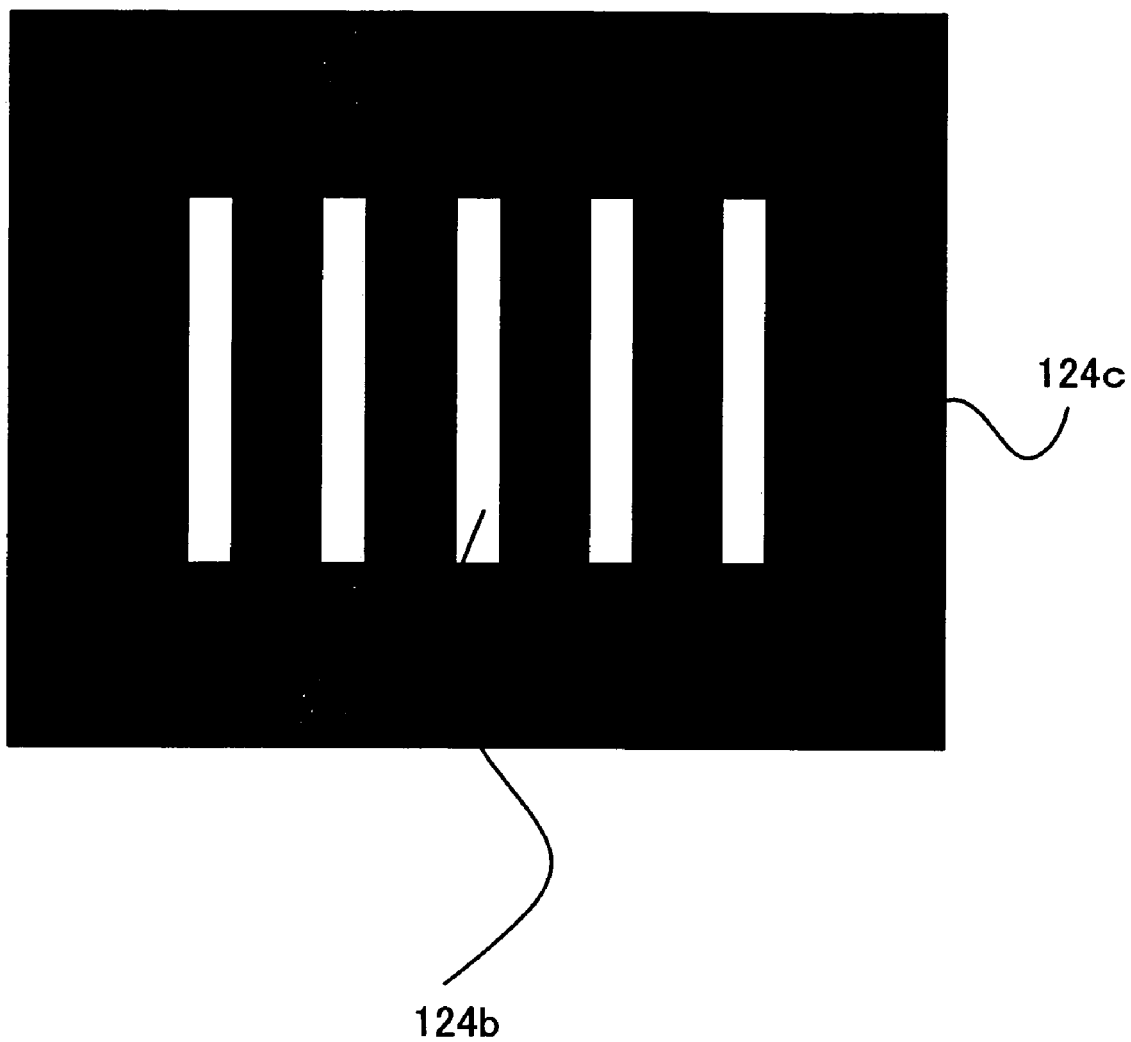
FIG. 9 is a schematic plane view of an alignment mark on a reticle-side reference plate.

Accordingly, the alignment mark 124 on the reticle-side reference plate 126 includes, as shown in FIG. 9, a light-transmitting part (or a mark part) 124b that transmits the UV light, and a light-shielding part 124c that shields the UV light. FIG. 9 is a schematic plane view of an exemplary alignment mark 124 on the reticle-side reference plate 126.

The UV light emitted from the light-transmitting part 124b of the alignment mark 124 reaches the wafer-side reference plate 146 on the wafer stage 145 via the projection optical system 130. The projection optical system 130 does not have chromatic aberration, as discussed above, and forms an image of the light-transmitting part 124b of the alignment mark 124, onto the pattern surface on the wafer-side reference plate 146. The wafer-side reference plate 146 is made of a material that transmits the UV light, such as quartz, and has the alignment mark 147 similar to the alignment mark 124 by the magnification of the projection optical system. The alignment mark 147 includes the mark part 147b that transmits the UV light, and the chrome surface 147a that shields the UV light. A light intensity sensor 167, such as a photo diode, is provided on the rear surface of the wafer-side reference plate 146.

The light intensity of the UV light that has transmitted through the mark part 147b in the alignment mark 147 is detected while the reticle stage 125 or the wafer stage 145 is driven in a measurement direction of the alignment mark 124 or 147 (or in a horizontal direction in FIG. 9). The light intensity becomes the highest when the alignment mark 124 on the reticle-side reference plate 126 accords with the alignment mark 147 on the wafer-side reference plate 146. Regarding focusing, the light intensity of the UV light that has transmitted through the mark part 147b in the alignment mark 147 is detected while the reticle stage 125 or the wafer stage 145 is driven in the direction Z. The light intensity becomes the highest when the alignment mark 124 on the reticle-side reference plate 126 focuses on the alignment mark 147 on the wafer-side reference plate 146.

Alternatively, the alignment mark 147 on the wafer-side reference plate 146 can use an alignment mark that has been rotated by 90° shown in FIG. 9. The measurement in the direction Y is available by moving the reticle stage 125 or the wafer stage 145 in the direction Y and detecting the light intensity of the UV light that has transmitted through the mark part 147 in the alignment mark 146. Thus, a positional relationship between the alignment mark 124 on the reticle-side reference plate 126 and the alignment mark 147 on the wafer-side reference plate 146 can be calculated without the enlargement optical system, by detecting a change of the light intensity of the UV light that has transmitted through the mark part 147 in the alignment mark 146 when the reticle stage 125 or the wafer stage 145 is moved.

Figure 10:
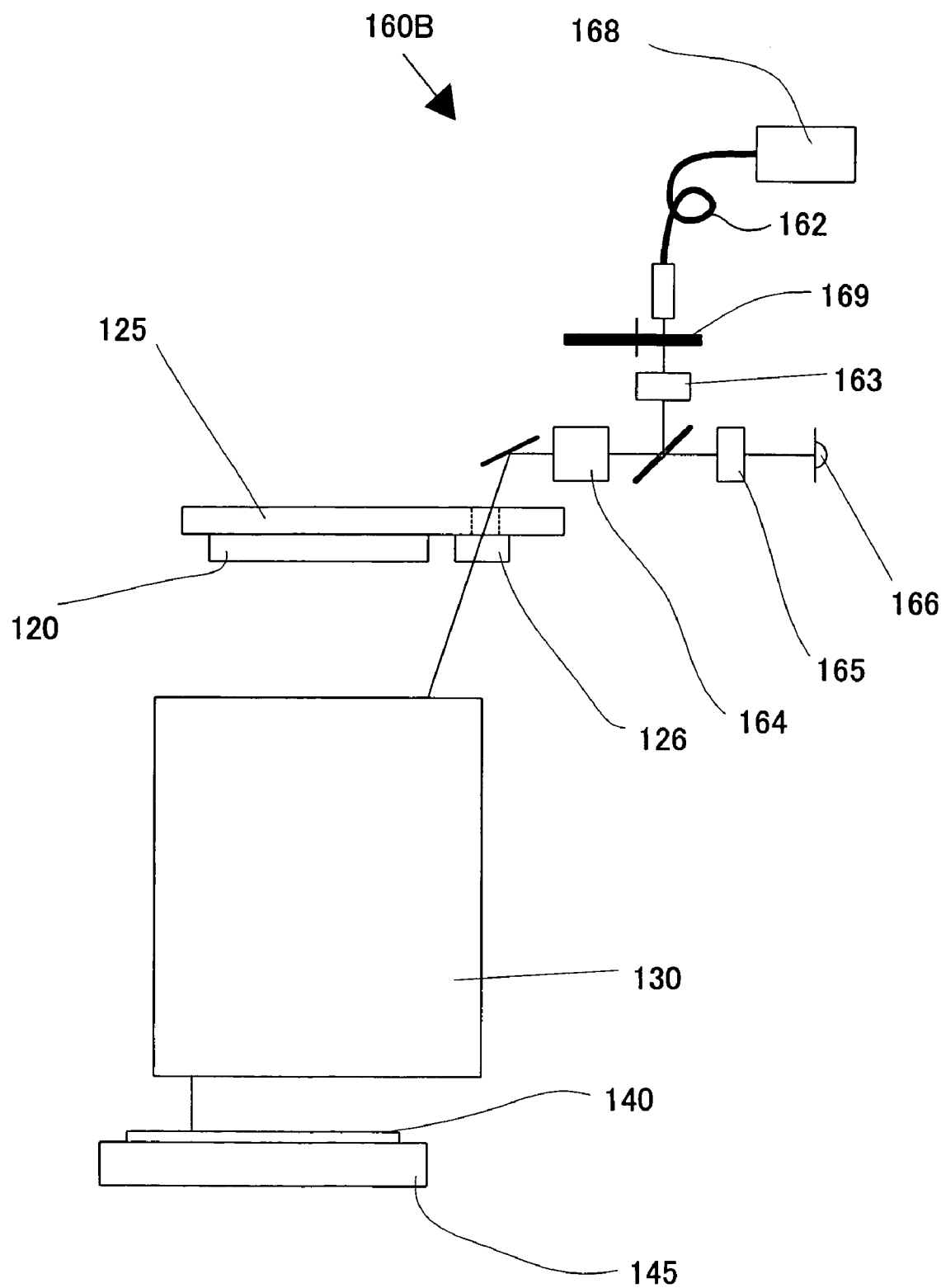
FIG. 10 is a schematic structure of a TTR alignment optical system having a wavelength selective filter.

When the resist applied onto the object 140 is not sensitive to the UV light, the above TTR alignment optical systems 160, 160A, and 160B can detect the alignment mark on the object 140 using the UV light. A description will be given of the TTR alignment optical system 160B. However, when the resist is sensitive to the UV light according to its types, the UV light cannot be used as it is for alignments of the object 140. Accordingly, as shown in FIG. 10, a light source for the TTR alignment optical system 160B uses a high-pressure mercury lamp 168 that emits light in a wave range from the UV light to the visible light, and the TTR alignment optical system 160B includes the wavelength selective filter 169 to select light having an insensitive wavelength according to the resist types. Here, FIG. 10 is a schematic structure of the TTR alignment optical system 160B having the wavelength selective filter 169.

A provision of the wavelength selective filter 169 enables the UV light to be selected for detections of the alignment mark on the wafer-side reference plate 146 provided on the wafer stage 145, and the non-exposure light that is insensitive to the resist to be selected for detections of the alignment mark of the resist-applied object 140. The wavelength selective filter 169 may be integrated with the high-pressure mercury lamp 168.

In exposure, the EUV light emitted from the illumination apparatus 110 illuminates the reticle 120, and images a pattern formed on the reticle 120 onto the object 140's surface. The instant embodiment uses an arc or ring shaped image plane, scans the reticle 120 and object 140 at a speed ratio corresponding to a reduction ratio of the projection optical system 130 to expose the entire surface of the reticle 120.

Whenever one scanning exposure ends on the object 140, the wafer stage 145 moves stepwise in the XY directions to a starting position for the next scanning exposure that synchronously scans the reticle 120 and object 140 at a speed ratio corresponding to a reduction ratio of the projection optical system 130. The synchronous scanning repeats while the reduced projection image on the reticle 120 is formed on the object 140, and the reticle 120's pattern is transferred on the entire surface on the object 140.

On the other hand, a contamination material or a misting or fogging material, such as an organic material, halide, and water molecules, is easily adhered to a surface of an optical element arranged in an optical path of the exposure light, such as an optical element in an optical system. This contamination material is gas in the atmosphere enclosing the optical element or generated, for example, from inner walls of a structure that supports the optical element, etc. The projection optical system includes a driven member, a motor, etc, such as a variable aperture stop, and impurities generated when the driven member is driven or outgas (or oil mist) from the motor may be adhered onto the surface of the optical element. The contamination material adhered to the optical element causes the reduced or non-uniform light intensity of the exposure light irradiated onto the object, lowered throughput, and deteriorated imaging performance. In particular, the EUV light is greatly absorbed by the contamination material, and subject to influence of the contamination material.

Figure 11:
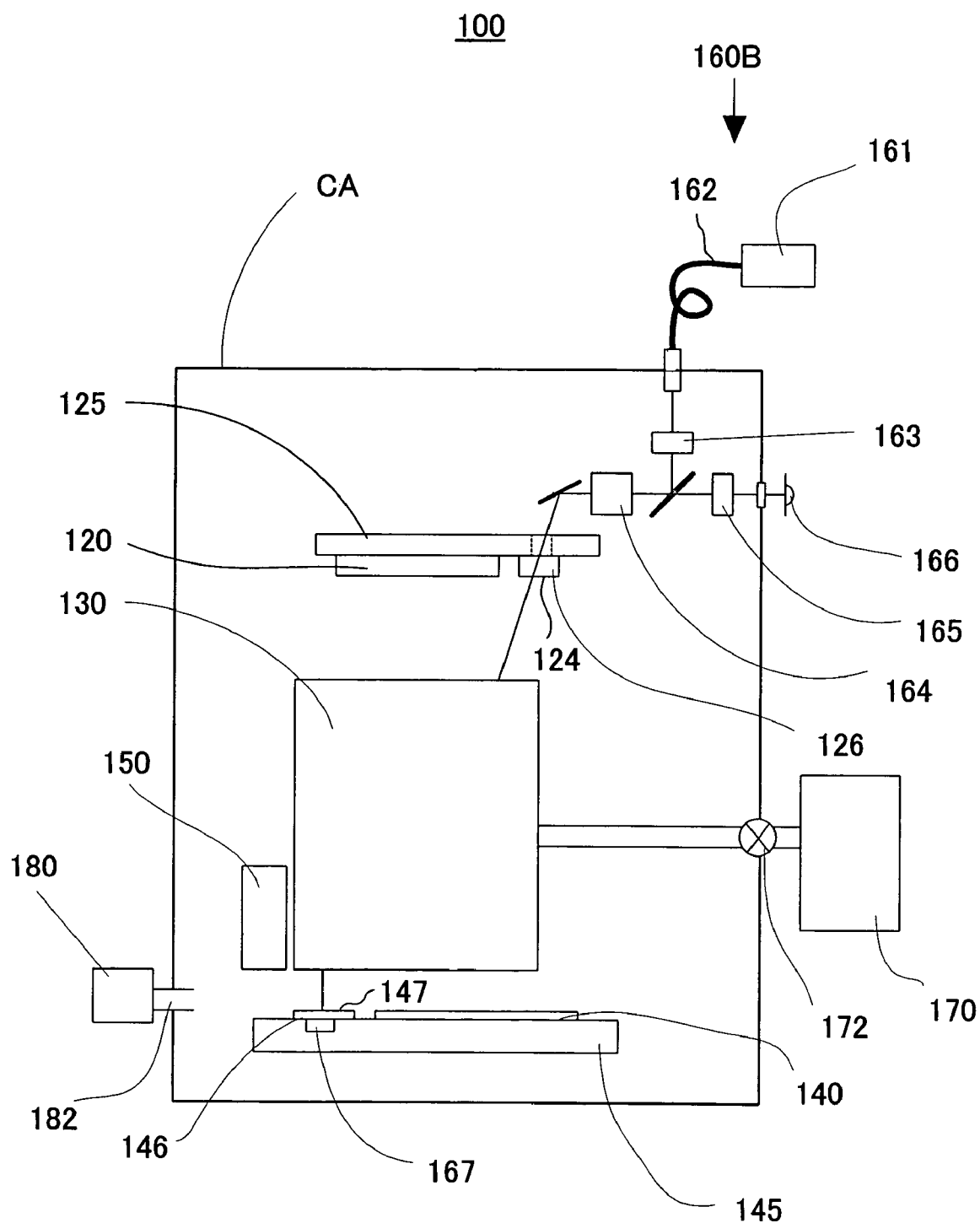
FIG. 11 is a schematic structure of an exposure apparatus having a gas cylinder that supplies gas in an optical path of the exposure light.

Accordingly, as shown in FIG. 11, a gas cylinder 170 for supplying gas, such as oxygen for optical cleansing, and a valve 172 are provided in the vacuum chamber CA of the exposure apparatus 100. Before the TTB alignment optical system 160B irradiates the UV light from the UV light source 161 onto the projection optical system 130, a small amount of gas is supplied to the exposure apparatus 100, in particular, an optical path in the projection optical system 130 from the gas cylinder 170 via the valve 172. A pump 180 preferably exhausts the gas supplied in the exposure apparatus 100, through an outlet 182 to the outside of the exposure apparatus 100. Here, FIG. 11 is a schematic structure of the exposure apparatus 100 that has the gas cylinder 170 that supplies gas in the optical path of the exposure light, and omits the illumination optical system 110.

Thereby, activated oxygen generated when the UV light is irradiated onto oxygen oxidizes and volatilizes organic materials to cleanse an optical element in the projection optical system 130, and to prevent the lowered transmittance of the projection optical system 130. Although the cleansing effect reduces, the optical cleansing can use activated oxygen generated when the UV irradiation dissolves the organic materials and remaining oxygen in the vacuum and thus the optical cleansing is available without a supply of oxygen from the outside through the gas cylinder 170.

When the alignment using the TTR alignment optical system 160B and the optical cleansing are simultaneously conducted, the inside of the projection optical system 130 is cleansed without causing lowered throughput. The regular alignments using the UV light can prevent the contaminations to the projection optical system 130. The alignment that uses the TTR alignment optical system 160B usually measures at plural image points in the projection optical system 130, but arrangements of these image points on an optical path of the EUV light as exposure light in the projection optical system 130 would effect the optical cleansing.

For optical cleansing with a supply of oxygen from the gas cylinder 170 and an alignment, the alignment measurement values may differ from the exposure time that maintains vacuum due to the degree of vacuum. Accordingly, a table of measurement values in the TTR alignment optical system has been prepared according to the degree of vacuum, and detected values are corrected according to the degree of vacuum at the time of alignment.

Figure 12:
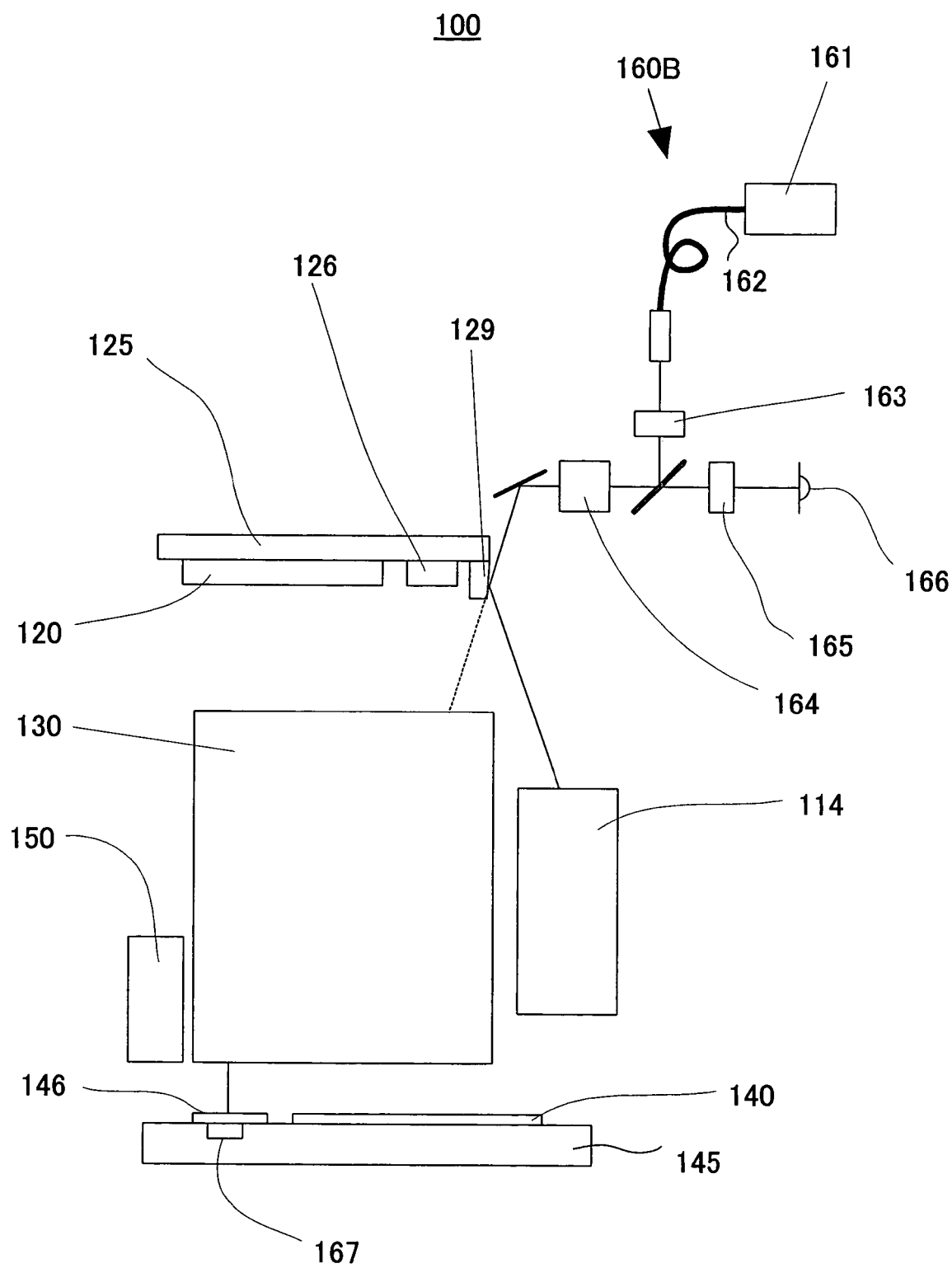
FIG. 12 is a schematic structure of an exposure apparatus that optically cleanses an illumination optical system.

An optical element in the illumination optical system 114 can be optically cleansed, as shown in FIG. 12, by introducing the UV light from the UV light source 161 in the TTR alignment optical system 160B into the illumination part 163 and the illumination optical system through the mirror 129 provided on the reticle stage 125. FIG. 12 is a schematic structure of the exposure apparatus 100 that can optically cleanse the inside of the illumination optical system 114, and omits the illumination apparatus 110's light source 112 and the vacuum chamber CA.

Thereby, at the time of maintenance of the exposure apparatus 100, etc., the UV light is incident upon and can optically cleanse the illumination optical system 114. The UV light introduced into the illumination optical system 114 for optical cleansing while the off-axis alignment optical system 150 is used for alignments of the object 140 would lead to periodic optical cleansing of the illumination optical system 114, and prevent the lowered transmittance of the illumination optical system 114.

Figure 13:
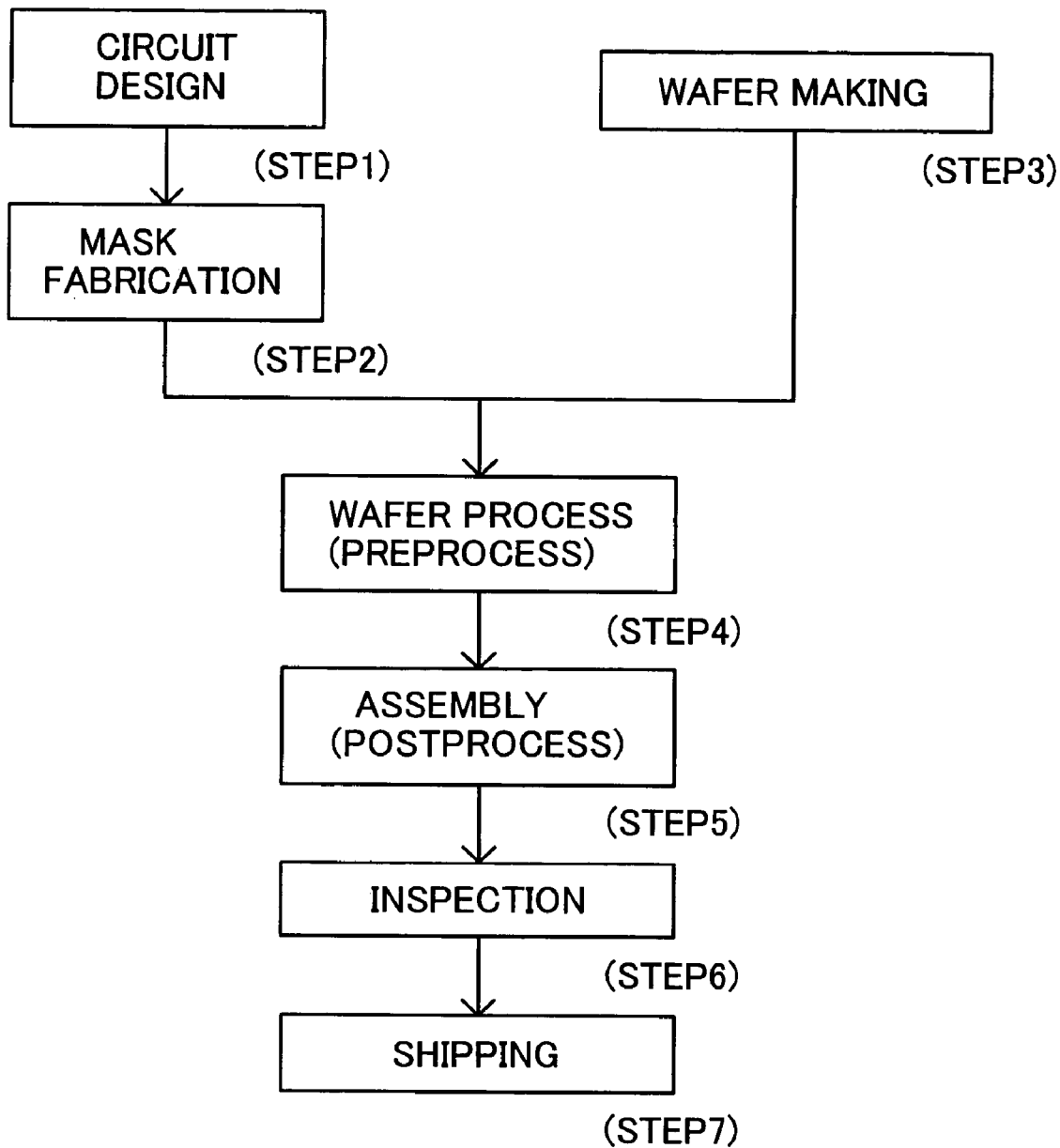
FIG. 13 is a flowchart for explaining a method for fabricating devices (semiconductor chips such as ICs, LSIs, and the like, LCDs, CCDs, etc.).
Figure 14:
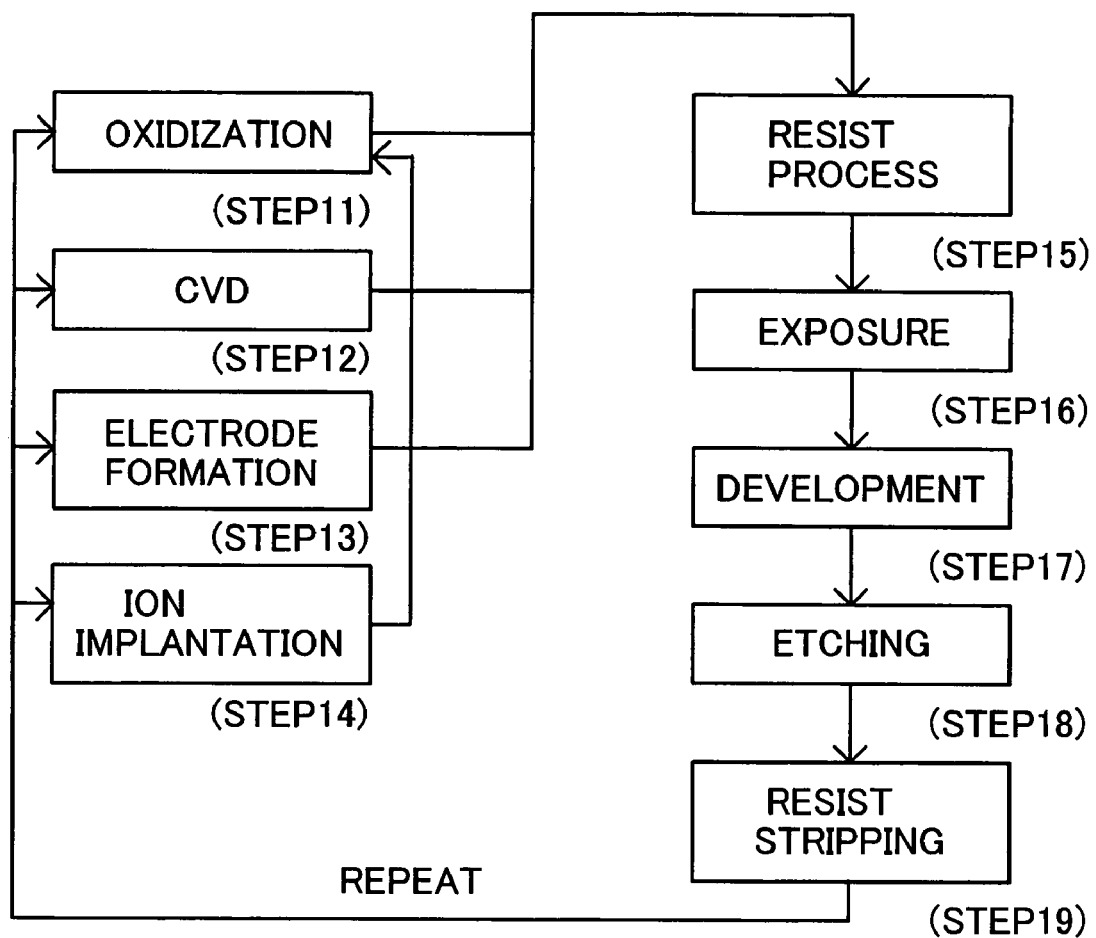
FIG. 14 is a detailed flowchart for Step 4 of wafer process shown in FIG. 13.
Figure 15:
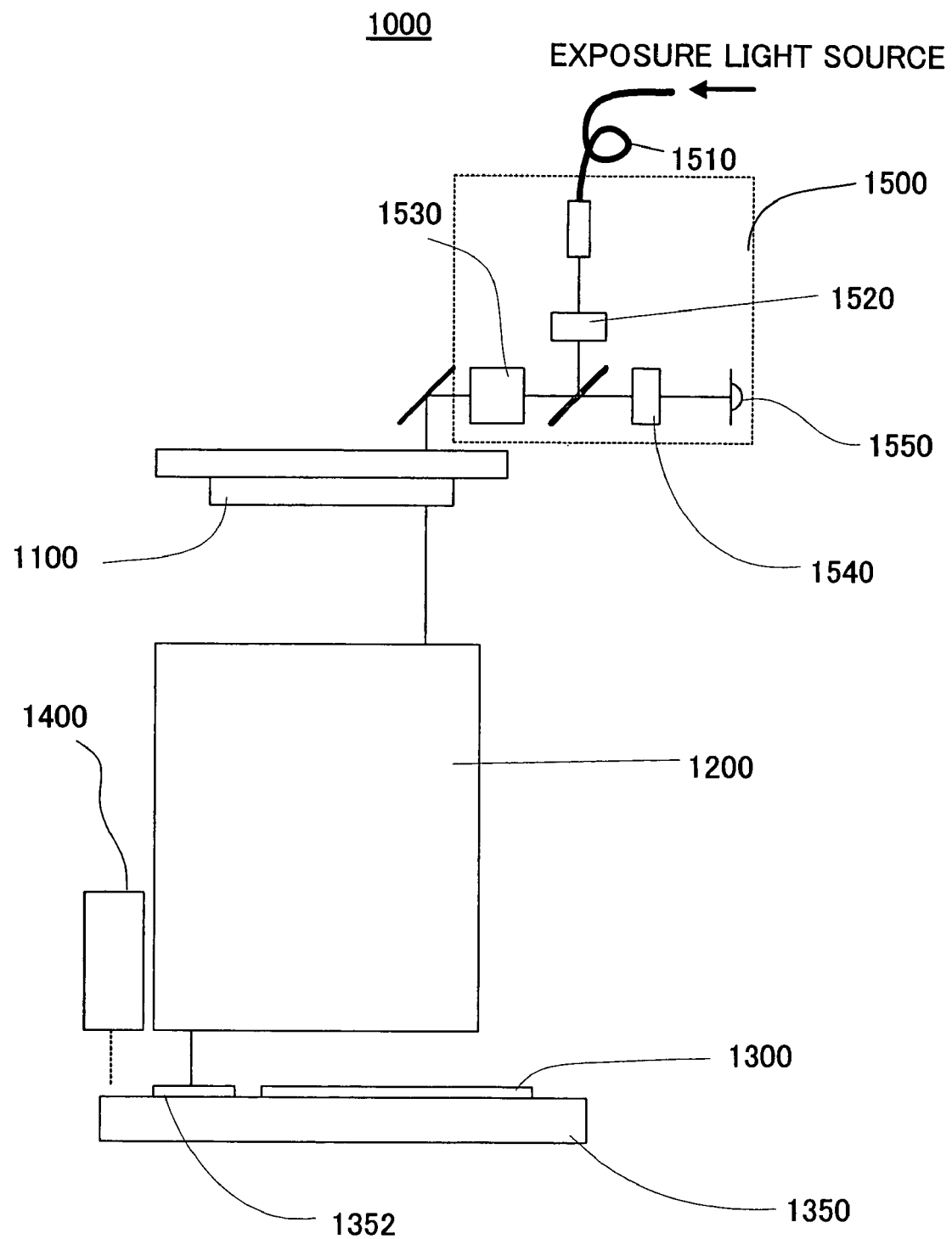
FIG. 15 is a schematic structure of a conventional exposure apparatus that uses KrF excimer laser and ArF excimer laser etc. for an exposure light source.

Referring to FIGS. 13 and 14, a description will now be given of an embodiment of a device fabricating method using the above exposure apparatus 100. FIG. 13 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 14 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 100 to expose a circuit pattern on the mask onto the wafer. Step 17 (development) develops the exposed wafer. Step 18 (etching,) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus 100, and the devices as finished goods also constitute one aspect of the present invention.

Further, the present invention is not limited to these preferred embodiments, and various variations and modifications may be made without departing from the scope of the present invention. For example, while the instant embodiment applies the UV light to the TTR alignment optical system for alignments, the UV light is applicable to a TTL alignment optical system that detects an alignment mark at the reticle or wafer side via the projection optical system. A light source of the UV light may be laser that emits light with a single wavelength or a light source that emits plural emission line spectra or light with a wave range. When the light source emits plural emission line spectra or light with a wave range, an appropriate wavelength is selected.

As discussed, the present invention can provide a highly precise alignment with a reasonable cost while using the EUV light as an exposure light source.

What is claimed is:

1. An exposure apparatus for projecting a pattern of a reticle onto an object to be exposed with first light having a wavelength of 20 nm or smaller, said exposure apparatus comprising:

a projection optical system for projecting the pattern onto the object; and a position detecting system for detecting a positional information of a mark by receiving a second light having a wavelength different from that of the first light via the projection optical system.

2. An exposure apparatus according to claim 1, wherein the second light has the wavelength between 150 nm and 370 nm.

3. An exposure apparatus according to claim 1, wherein said mark is at least one of a mark formed on the reticle and the object.

4. An exposure apparatus according to claim 1, further comprising at least one of a first stage for mounting the reticle and a second stage for mounting the object, wherein said mark is formed on at least one of said first and second stage.

5. An exposure apparatus according to claim 1, wherein said position detecting system includes an optical system of a dioptric system that introduces the second light from projection optical system to a light receiving element.

6. An exposure apparatus according to claim 1, wherein said position detecting system includes an optical system that introduces the second light into said projection optical system so that an image point at an arbitrary point in said projection optical system has the same optical path as that of the first light in said projection optical system.

7. An exposure apparatus according to claim 1, wherein said position detecting system receive the second light which passed through the projection optical system once.

8. An exposure apparatus according to claim 1, wherein said projection optical system includes a multilayer mirror made of molybdenum and silicon.

9. An exposure apparatus according to claim 1, further comprising a gas cylinder for supplying predetermined gas in an optical path of the first light.

10. An exposure apparatus according to claim 1, wherein said position detecting system includes a wavelength selective filter for selecting a wavelength from light that contains the second light emitted from a light source.

11. An exposure method for exposing a pattern of a reticle by projecting the pattern onto an object through a projection optical system with first light having a wavelength of 20 nm or smaller, said exposure method comprising the step of aligning the reticle with the object via the projection optical system using second light having a wavelength different from that of the first light.

12. An exposure method according to claim 11, further comprising the step of cleansing an optical element in said projection optical system by using the second light.

13. An exposure method according to claim 12, wherein said aligning step and said cleansing step are conducted simultaneously.

14. A device fabricating method comprising the steps of:
exposing a pattern on a reticle onto an object using an exposure apparatus; and
developing the exposed object,
wherein said exposure apparatus projects the pattern onto the object with first light having a wavelength of 20 nm or smaller, and includes:
a projection optical system for projecting the pattern onto the object; and
a position detecting system for detecting a positional information of a mark by receiving a second light having a wavelength different from that of the first light via the projection optical system.

* * * * *